United States Patent
Chen et al.

(10) Patent No.: US 6,752,577 B2
(45) Date of Patent: Jun. 22, 2004

(54) HEAT SINK FASTENER

(75) Inventors: Hong-Long Chen, Panchiao (TW); Kwo-Hsing Chen, Panchiao (TW)

(73) Assignee: Shu-Chen Teng, Taipei (TW)

( * ) Notice: Subject to any disclaimer, the term of this patent is extended or adjusted under 35 U.S.C. 154(b) by 239 days.

(21) Appl. No.: 10/083,350

(22) Filed: Feb. 27, 2002

(65) Prior Publication Data

US 2003/0161085 A1 Aug. 28, 2003

(51) Int. Cl.[7] .......................... H05K 7/20; F16B 19/00
(52) U.S. Cl. .................. 411/508; 411/509; 411/347; 411/544; 411/913; 361/704; 267/166.1; 165/80.3
(58) Field of Search .................. 411/12, 508, 347, 411/498, 509, 544, 913, 289; 267/166.1; 165/80.3; 361/704

(56) References Cited

U.S. PATENT DOCUMENTS

| 380,651 | A | * | 4/1888 | Fowler et al. | 267/166.1 |
|---|---|---|---|---|---|
| 1,751,261 | A | * | 3/1930 | Wilson | 267/166.1 |
| 2,410,290 | A | * | 10/1946 | Keysor | 267/166.1 |
| 2,751,179 | A | * | 6/1956 | Oravec | 267/140.4 |
| 3,604,876 | A | * | 9/1971 | Pasbrig | 200/275 |
| 4,077,619 | A | * | 3/1978 | Borlinghaus | 267/166.1 |
| 4,111,407 | A | * | 9/1978 | Stager | 267/166.1 |
| 4,120,489 | A | * | 10/1978 | Borlinghaus | 267/166.1 |
| 4,204,566 | A | * | 5/1980 | Kirrish et al. | 411/324 |
| 5,246,215 | A | * | 9/1993 | Takamura et al. | 267/170 |
| 5,730,210 | A | * | 3/1998 | Kou | 165/80.3 |
| 6,304,452 | B1 | * | 10/2001 | Lo | 361/704 |
| 6,307,748 | B1 | * | 10/2001 | Lin et al. | 361/704 |
| 6,341,962 | B1 | * | 1/2002 | Sinclair | 439/66 |
| 6,412,546 | B1 | * | 7/2002 | Lin et al. | 165/80.3 |
| 2002/0112863 | A1 | * | 8/2002 | Padgett et al. | 169/56 |
| 2003/0159819 | A1 | * | 8/2003 | Lee | 165/185 |

FOREIGN PATENT DOCUMENTS

| JP | 410318238 A | * | 12/1998 | ........... F16B/43/00 |
|---|---|---|---|---|
| US | EP1096613 A2 | * | 5/2001 | ......... H01R/13/193 |

* cited by examiner

Primary Examiner—Robert J. Sandy
Assistant Examiner—Katherine Mitchell
(74) Attorney, Agent, or Firm—Bacon & Thomas, PLLC

(57) ABSTRACT

A heat sink fastener includes a locating bolt having a compressible barbed tip for securing the heat sink to the circuit board, and a buffer spring mounted on the locating bolt and adapted to force the heat sink downwards into close contact with the CPU at the circuit board, the buffer spring has a top ring defining a top receiving space, a bottom ring defining a bottom receiving space, and a double conical spiral spring body connected between the top ring and the bottom ring and receivable in the top receiving space and the bottom receiving space when compressed.

3 Claims, 4 Drawing Sheets

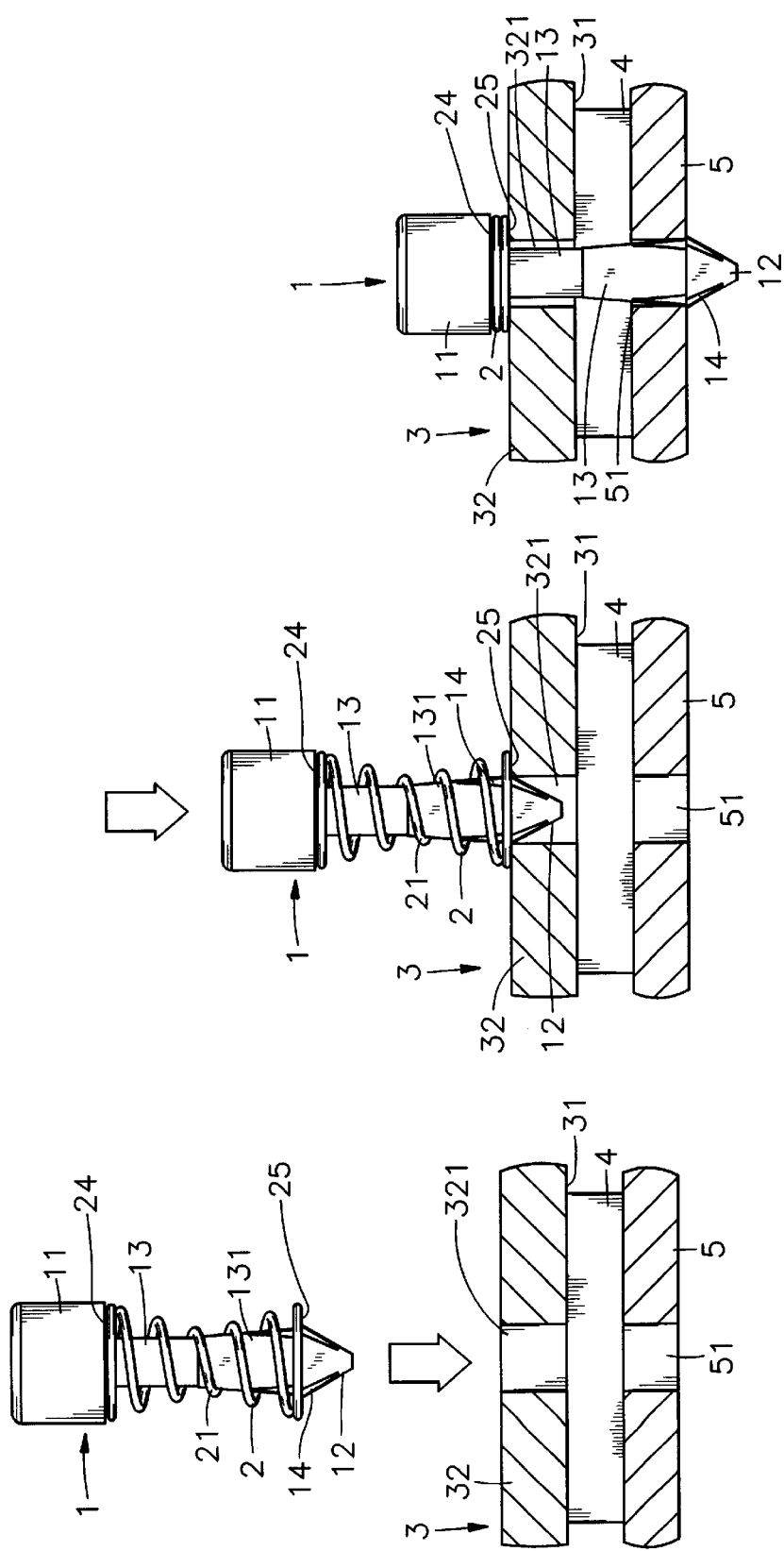

HEAT SINK FASTENER

BACKGROUND OF THE INVENTION

1. Field of the Invention

The present invention relates to a central processing unit (CPU) cooling structure and, more specifically, to a heat sink fastener, which uses a buffer spring having a double conical spiral spring body instead of a conventional compression spring to prevent vibration during installation.

2. Description of the Related Art

FIG. 6 illustrates a heat sink fastener used in a CPU cooling structure according to the prior art. This design of heat sink fastener is comprised of a locating bolt A, and a compression spring B mounted on the locating bolt A and stopped between the head A1 and barbed tip A2 of the locating bolt A. By means of the barbed tip A2, the locating bolt A is fixedly fastened to one mounting hole C1 of the circuit board C. This structure of heat sink fastener is still not satisfactory in function because of the following drawbacks.

1. The compression spring B vibrates when compressed, resulting in unstable positioning of the locating bolt A.

2. Because the top and bottom ends of the compression spring B are not maintained in horizontal when the compression spring B compressed, it is difficult to keep the compressed compression spring B in position.

3. When the compression spring B compressed, the periphery of the compression spring B may touch the circuit of the circuit board C by accident, thereby causing a short circuit.

SUMMARY OF THE INVENTION

The present invention has been accomplished to provide a heat sink fastener, which eliminates the aforesaid drawbacks. The invention uses a buffer spring instead of compression spring. The buffer spring has a top ring defining a top receiving space, a bottom ring defining a bottom receiving space, and a double conical spiral spring body connected between the top ring and the bottom ring and receivable in the top receiving space and the bottom receiving space when compressed. The top ring and the bottom ring are horizontally maintained in parallel, preventing the double conical spiral spring body from bias when compressed. When compressed, the compressed double conical spiral spring body is received within the top receiving space and bottom receiving space, holding the locating bolt stably in position. Further, because the spring body of the buffer spring has a double conical spiral design, it keeps in balance when compressed.

BRIEF DESCRIPTION OF THE DRAWINGS

FIG. 3 is a sectional view showing the installation of the heat sink fastener according to the present invention (Step I).

FIG. 4 is a sectional view showing the installation of the heat sink fastener according to the present invention (Step II).

FIG. 5 is a sectional view showing the installation of the heat sink fastener according to the present invention (Step III).

DETAILED DESCRIPTION OF THE PREFERRED EMBODIMENT

Figure 1:
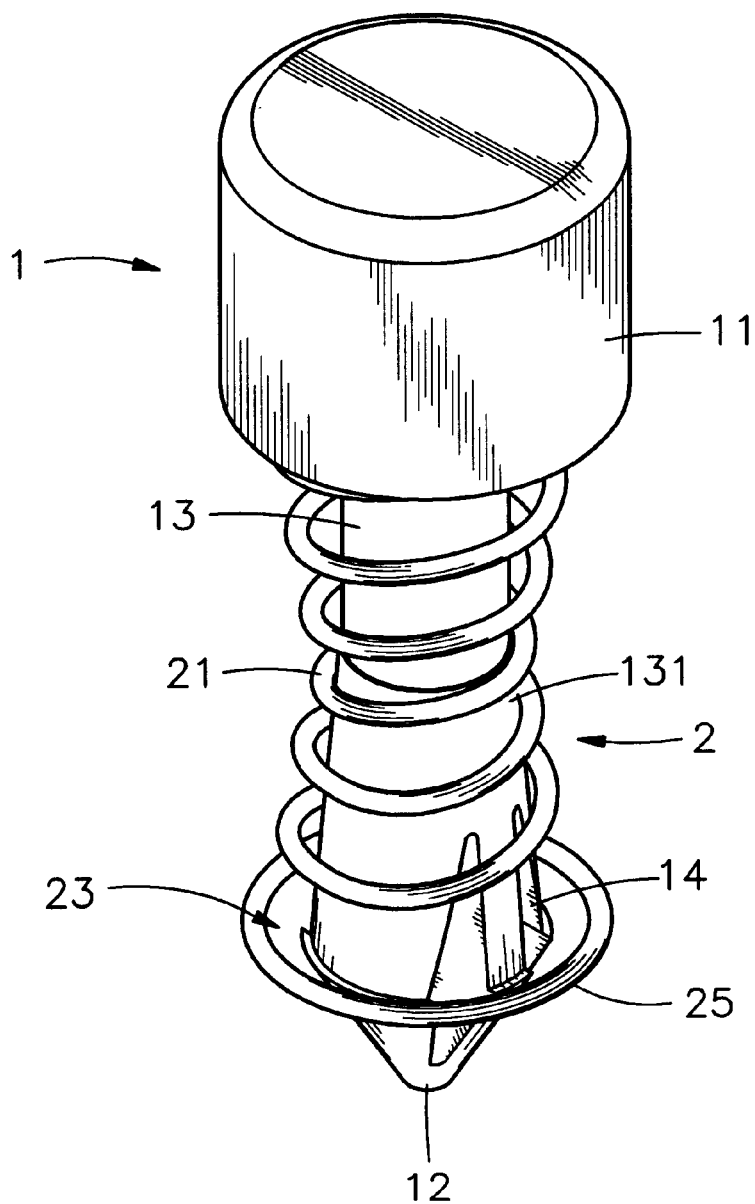
FIG. 1 is a perspective view of a heat sink fastener according to the present invention.
Figure 2:
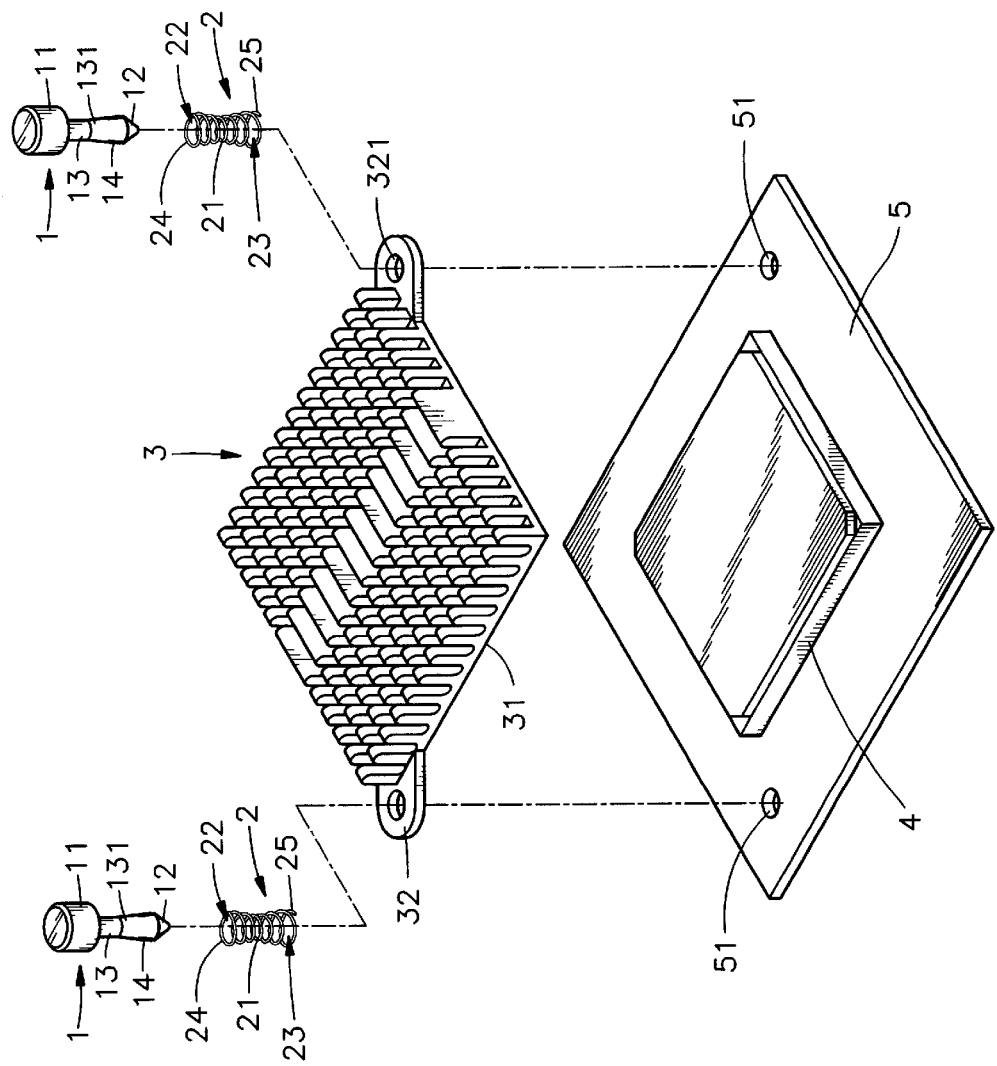
FIG. 2 is an exploded view of a CPU cooling structure constructed according to the present invention.
Figure 6:
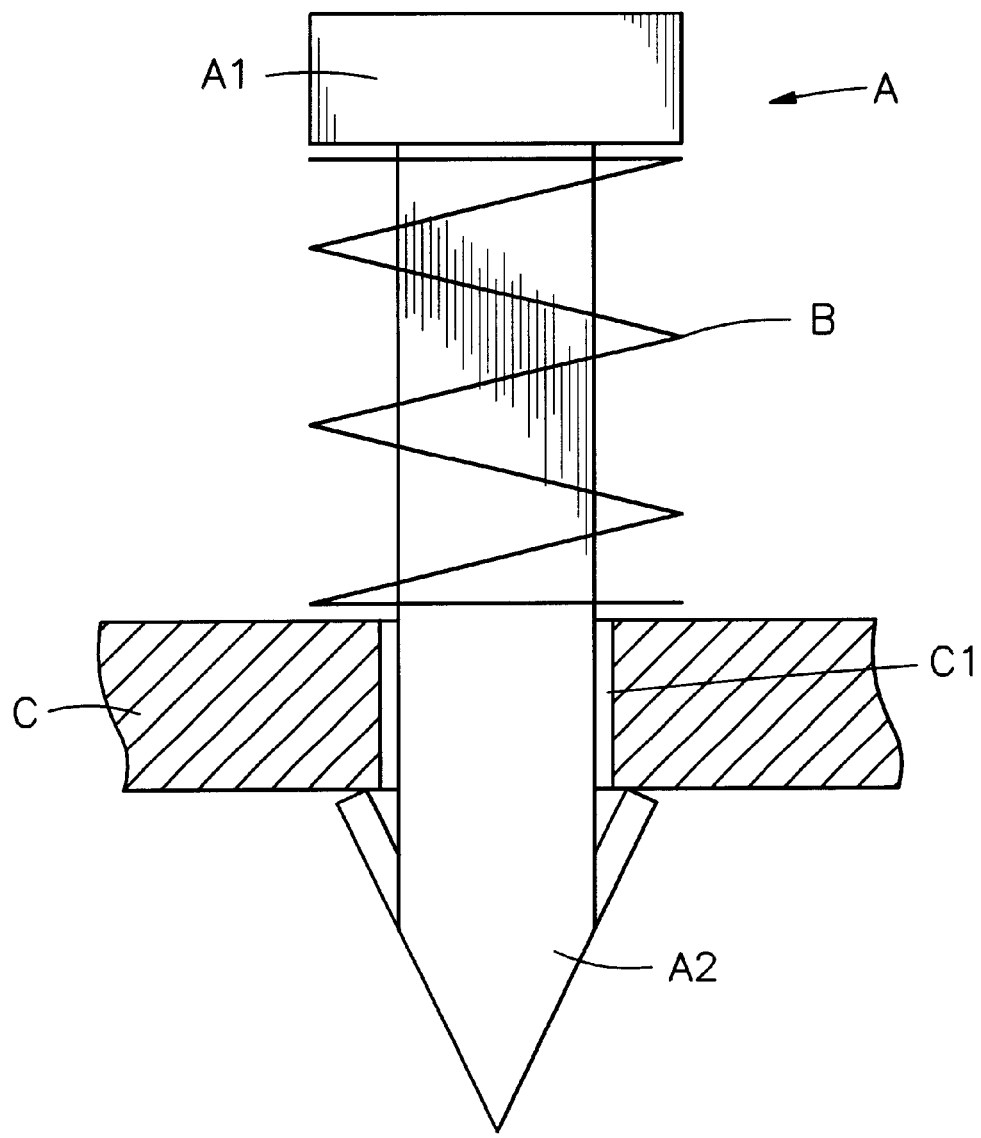
FIG. 6 is a sectional view of a heat sink fastener according to the prior art.

Referring to FIGS. 1 and 2, a heat sink fastener is shown comprised of a locating bolt 1 and a buffer spring 2.

The locating bolt 1 comprises a head 11, a neck 13 downwardly extended from the center of the bottom side of the head 11, a tapered shank 131 axially extended from one end of the neck 13 remote from the head 11, a barbed tip 12 extended from the end of the tapered shank 131 remote from the neck 13, and a radial opening 14 cut through the connection area between the tapered shank 131 and the barbed tip 12.

The buffer spring 2 comprises a top ring 24 defining a top receiving space 22, a bottom ring 25 defining a bottom receiving space 23, and a double conical spiral spring body 21 connected between the top ring 24 and the bottom ring 25. The top ring 24 and the bottom ring 25 are horizontally arranged in parallel. When the buffer spring 2 compressed, the compressed double conical spiral spring body 21 is received within the receiving spaces 22 and 23.

Referring to FIGS. from 3 through 5 and FIG. 2 again, after the flat bottom surface 31 of the heat sink 3 has been attached to the top surface of the CPU 4, the mounting holes 321 of the lugs 32 of the heat sink 3 are respectively aimed at the respective mounting holes 51 of the circuit board 5 carrying the CPU 4, and then the heat sink fasteners are respectively fastened to the mounting holes 321 and 51 to fixedly secure the heat sink 3 to the circuit board 5. During installation of each heat sink fastener, the barbed tip 12 of the locating bolt 1 is inserted through the mounting hole 321 of one lug 32 of the heat sink 3 for enabling the bottom ring 25 of the buffer spring 2 to be stopped above the corresponding lug 32 of the heat sink 3, and the locating bolt 1 is pressed down to force the barbed tip 12 of the locating bolt 1 into engagement with the corresponding mounting hole 51 of the circuit board 5. Because of the effect of the radial opening 14, the connecting area between the barbed tip 12 and the double conical spiral spring body 21 is radially compressible so that the barbed tip 12 can easily be forced into the corresponding mounting hole 51 of the circuit board 5. At this time, the double conical spiral spring body 21 is compressed and received within the receiving spaces 22 and 23, and the barbed tip 12 is maintained engaged with the corresponding mounting hole 51 of the circuit board 5 to secure the heat sink 3 and the circuit board 5 firmly together. When installed, the buffer spring 2 imparts a downward pressure to the heat sink 3, keeping the heat sink 3 in close contact with the CPU 4.

A prototype of heat sink fastener has been constructed with the features of the annexed drawings of FIGS. 1~5. The heat sink fastener functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A heat sink fastener comprising a locating bolt, said locating bolt comprising a head, a neck extending from the head and terminating in a tapered shank having a barbed tip, and a buffer spring mounted on said locating bolt and disposed between said head and said barbed tip, wherein said buffer spring comprises a top ring defining a top receiving space, a bottom ring defining a bottom receiving space, and a double conical spiral spring body connected between said top ring and said bottom ring and receivable in said top receiving space and said bottom receiving space when compressed.

2. The heat sink fastener as claimed in claim 1, wherein said top ring and said bottom ring are horizontally arranged in parallel.

3. The heat sink fastener as claimed in claim 1, wherein said locating bolt further includes a connection area between said barbed tip and said tapered shank, and at least one radial hole cut through the connection area.

* * * * *